(12) United States Patent
Kirillov (10) Patent No.: US 11,647,606 B2
(45) Date of Patent: May 9, 2023

(54) FAST FLOW COOLING BATH FOR MULTIPROCESSOR CIRCUIT BOARDS

(71) Applicant: Ivan Kirillov, Moscow (RU)

(72) Inventor: Ivan Kirillov, Moscow (RU)

(73) Assignee: Ivan Kirillov, Moscow (RU)

( * ) Notice: Subject to any disclaimer, the term of this patent is extended or adjusted under 35 U.S.C. 154(b) by 0 days.

(21) Appl. No.: 17/084,006

(22) Filed: Oct. 29, 2020

(65) Prior Publication Data

US 2022/0022343 A1 Jan. 20, 2022

Related U.S. Application Data

(63) Continuation of application No. PCT/RU2020/000357, filed on Jul. 20, 2020.

(51) Int. Cl.
*H05K 7/20* (2006.01)

(52) U.S. Cl.
CPC ..... *H05K 7/20236* (2013.01); *H05K 7/20272* (2013.01)

(58) Field of Classification Search
CPC .................................................. H05K 7/20236
See application file for complete search history.

(56) References Cited

U.S. PATENT DOCUMENTS

| | | | |
|---|---|---|---|
| 9,504,190 B2 * | 11/2016 | Best | G06F 1/20 |
| 10,405,457 B2 * | 9/2019 | Boyd | H01L 23/44 |
| 10,624,242 B2 * | 4/2020 | Best | H05K 7/20236 |
| 10,820,446 B2 * | 10/2020 | Boyd | H01L 23/44 |
| 11,006,547 B2 * | 5/2021 | Gao | G06F 1/20 |
| 11,032,943 B2 * | 6/2021 | Li | H05K 7/20263 |
| 2004/0206101 A1 | 10/2004 | Bash et al. | |
| 2005/0081534 A1 * | 4/2005 | Suzuki | F28D 15/00 62/50.2 |
| 2018/0356866 A1 * | 12/2018 | Saito | H05K 7/20236 |

FOREIGN PATENT DOCUMENTS

| | | | |
|---|---|---|---|
| KR | 10-20050037335 A | 4/2005 | |
| WO | 2014109869 A1 | 7/2014 | |
| WO | 2019132696 A1 | 7/2019 | |
| WO | WO-2020216954 A1 * | 10/2020 | ......... H05K 7/20781 |
| WO | WO-2021150131 A1 * | 7/2021 | ......... H05K 7/20781 |

OTHER PUBLICATIONS

International Search Report issued in corresponding PCT Patent Application No. PCT/RU2020/000357, dated Feb. 18, 2021 (2 pages).

\* cited by examiner

*Primary Examiner* — Robert J Hoffberg (74) *Attorney, Agent, or Firm* — Pillsbury Winthrop Shaw Pittman, LLP (57) ABSTRACT

A system and a method are disclosed for a cooling bath designed to cool a high density of devices within the bath. Coolant is circulated between the cooling bath and external pumps, which use a high flow rate of coolant to cool the high density of devices. The cooling bath includes inlet pipes, distribution pipes, a device chamber, and draining sections. The inlet pipes and distribution pipes are structured such that a mound of coolant may accumulate within the bath, forming a peak near the center of the bath. Coolant flows in a direction from the center of the bath towards draining sections on opposing ends of the bath. Draining sections are structured to receive hot coolant at a relatively slow flow rate and prevent air from being expelled from the cooling bath with the hot coolant.

20 Claims, 9 Drawing Sheets

FAST FLOW COOLING BATH FOR MULTIPROCESSOR CIRCUIT BOARDS

CROSS-REFERENCE TO RELATED APPLICATION

This application is the U.S. National Phase Application claiming priority to International Application No. PCT/RU2020/000357, filed Jul. 20, 2020, the entire contents of which is hereby incorporated by reference in full.

TECHNICAL FIELD

The disclosure generally relates to the field of cooling configurations for multiprocessor circuit boards.

BACKGROUND

A circuit board holding unit, called a bath, can hold many circuit boards with processors that generate a large amount of heat. To cool the boards down, coolant is propagated through heatsink ribs. As computer chip sizes decrease (e.g., 7 nm technology), the flow of coolant needed to cool the smaller chips increases. For example, to remove 5 kilowatts (kW) of heat generated by a board, a flow rate of 2.5 cubic meters per hour ($m^3/h$) through the heatsink ribs may be needed. High densities of boards are often needed for processor intensive operations, occupying a large space within a cooling bath and limiting the space available for cooling mechanisms.

For a conventional cooling baths, if the bath, i.e., a circuit board holding unit, is large (e.g., 12 m long) with a high flow of coolant within the bath, a number of challenges may be created. Hundreds of boards may fit within the bath, requiring an evenly distributed flow throughout the bath such that each board can still receive 2.5 $m^3/h$ of coolant flow for a necessary amount of heat transfer (e.g., a total flow rate of 960 $m^3/h$). External pumps coupled to the cooling bath enable this flow rate. However, the large flow rate needed leads to problems circulating coolant between the pumps and the bath without also suctioning air. When air enters the pumps, air cavitates inside the pump, which affects the flow generated by the pump, generates bubbles of air within the coolant, and reduces the efficiency of the heat exchange process within the cooling bath. A cooling system is desired that can facilitate a high rate of coolant flow needed to cool a high density of circuit boards without allowing air to escape the cooling bath.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

DETAILED DESCRIPTION

The Figures and the following description relate to preferred embodiments by way of illustration only. It should be noted that from the following discussion, alternative embodiments of the structures and methods disclosed herein will be readily recognized as viable alternatives that may be employed without departing from the principles of what is listed in the appended claims.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Configuration Overview

Disclosed is a cooling bath for multiprocessor circuit boards. The cooling bath is configured to dissipate large levels of heat generated from the multiprocessor circuit boards. This large volume of heat is generated when the multiprocessor circuit boards are undertaking highly intensive computing (processing) activity, for example, bitcoin mining or complex simulations (e.g., visual modeling).

Figure 1:
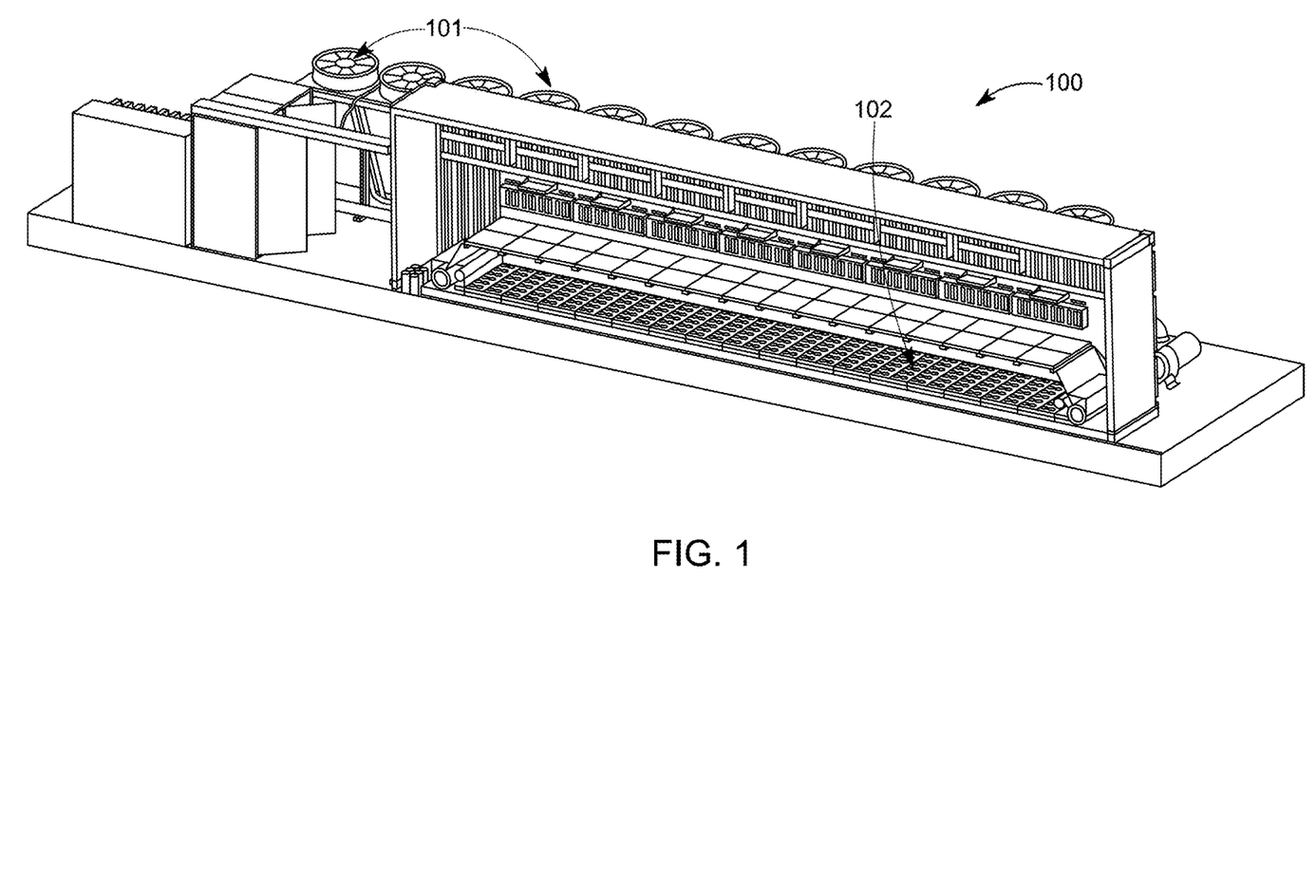
FIG. 1 illustrates a cooling system according to one example embodiment.

FIG. 1 illustrates a cooling system according to one example embodiment. The cooling system includes cooling bath 102 within container 100 and chillers 101 external to container 100. The term "cooling bath," as referred to herein, describes any housing unit capable of cooling heat-generating electronic devices or hardware modules using a coolant to absorb heat from the heat-generating electronic devices. In some embodiments, container 100 is 12.19 meters (m) long (40 feet (ft)) or approximately 12 m long, having a length similar to an intermodal container. Each 12-m container may dissipate over 2 MW of heat from installed circuit boards. In one example embodiment, a single cooling bath may fit within container 100, where and have a size of the bath of 12 meters by 2.6 meters. Cooling bath dimensions are further described in the description of FIG. 3.

Chillers 101 located external to container 100 cool the hot coolant expelled from cooling bath 102. Each chiller may include one or more fans that function to lower the temperature of the hot coolant. In some embodiments, chillers 101 are integrated with a control system such that each fan has an integrated variable frequency drive (VFD) and is operated by a MODBUS protocol. In this way, each fan's rotation speed may be controlled individually and the temperature of coolant flowing through pipes being cooled by chillers 101 may be adjusted with finer granularity. Additional chillers may be on both sides of container 100 although not shown in FIG. 1.

Figure 2:
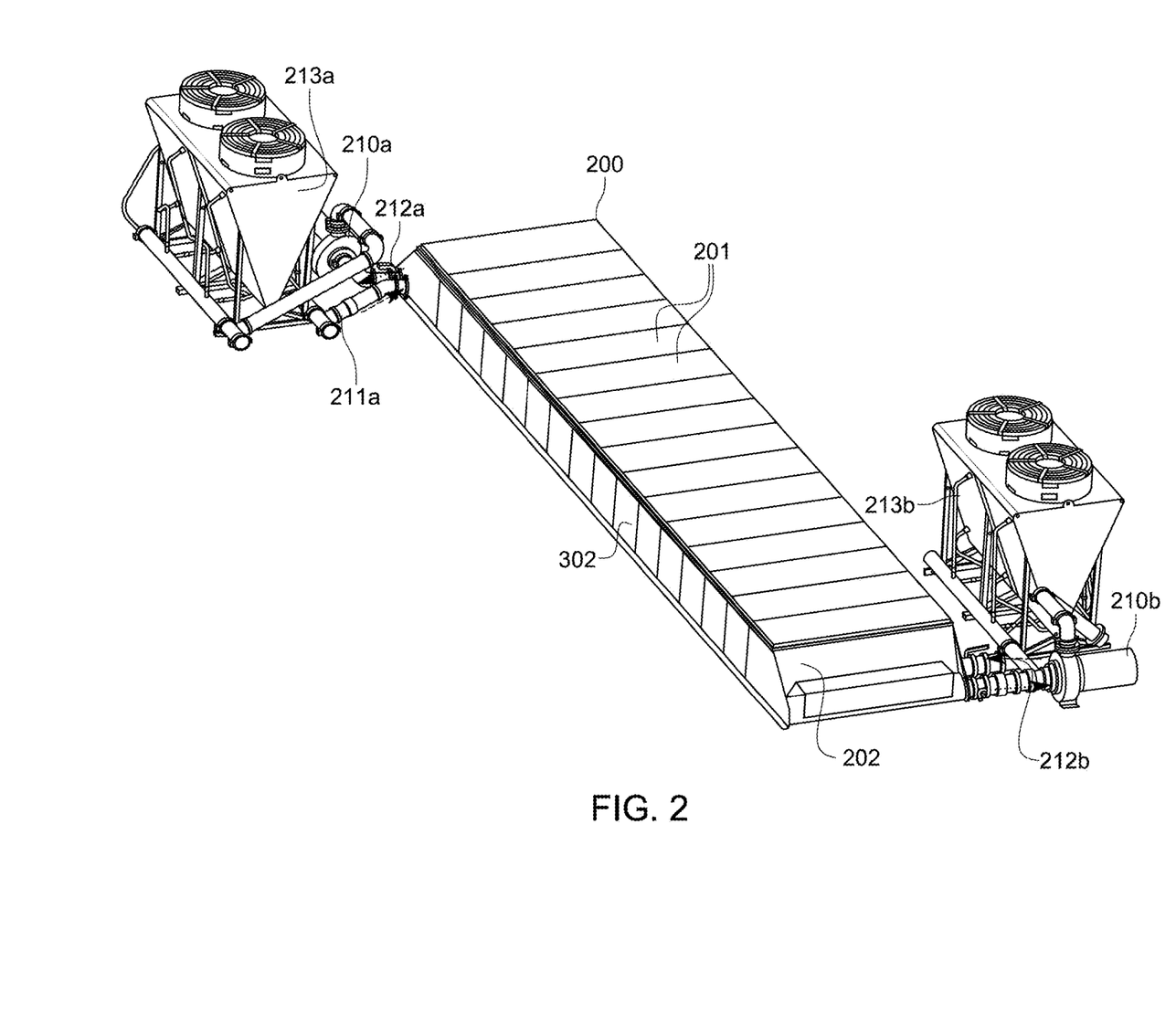
FIG. 2 illustrates a view of a cooling bath according to one example embodiment.

FIG. 2 illustrates a view of a cooling bath according to one example embodiment. The cooling bath 200 includes one or more lids 201. Cooling bath 200 is coupled to a first external pump 210a and a second external pump 210b. The structure of cooling bath 200 includes four walls (e.g., walls 202), a cover, and a base. A length of cooling bath 200 can be substantially the length of container 100 to optimize space within the container. The width of cooling bath 200 may be half the width of container 100. Each wall of cooling bath 200 has a first surface and a second surface. One of the surfaces faces inward and an opposite surface faces outward relative to an interior of the cooling bath 200. Each surface is bounded by four edges: a first side edge, a second side edge, a top edge, and a bottom edge. There may be four walls. A first wall and a second walls have interior surfaces that are opposite one another along a length of the holding unit. A third wall and a fourth wall have interior surfaces that are opposite one another along a width of the holding unit and adjacent to the first wall and the second wall.

The cover has a first surface and a second surface. One surface is outward facing and one surface is inward facing relative to the interior of the cooling bath 200. The surfaces are bounded by four edges that are joined to the top edge of the walls. The cover may be dimensioned of the width of the holding unit and a first length, where the first length may be shorter than the length of the holding unit. The cover may include one or more lids 201 that may be fit adjacent to each other to form the cover and enclose the interior of the cooling bath. The base may have a first and a second surface. One surface is outward facing and one surface is inward facing relative to the interior of the cooling bath 200. The surfaces bounded by four edges that are joined to the bottom edge of the walls. The base may be dimensioned of the width of the holding unit and a second length, where the second length may be a length that is greater than the first length but no greater than the length of the holding unit. The walls, the cover and the base are structured to form the housing with the interior for the cooling bath 200.

A coolant may be used to cool devices held within cooling bath 200. The coolant may be a liquid with dielectric properties. To support a heat transfer process, the colorant may have a low viscosity and sufficient thermal conductivity. In some embodiments, the coolant may have a viscosity of 5-15 centistokes (cST) at an operating temperature of 60 degrees Celsius and a thermal conductivity of at least 0.10 watts per meter-kelvin (W/(m*K)). For example, at 60 degrees Celsius, the kinematic viscosity of the coolant may be 7 cST, the thermal conductivity may be 0.138 W/(m*K), and the specific heat may be 2.1 kilojoules per kilogram per degree Celsius (kJ/kg*C). The coolant may be at least an order of magnitude more viscose than water.

Pumps 210a and 210b may create flow from each side of cooling bath 200. In one example, the flow rate created by each pump 210a, 210b may be approximately 450 cubic meters per hour (m³/h). Coolant flow rates may vary between 200-550 m³/h. As coolant is pumped from each pump on opposite ends (e.g., cattycorner) into the bath, the flow of the coolant may reach a maximum height at the center of cooling bath 200. The height may assume the same approximate rate of flow from each pump as well as distribution throughout the bath that may be controlled due to other structural features of the bath. Examples of such structural features are described in further detail in the descriptions of FIGS. 3-9.

A coolant may enter into cooling bath 200 through inlet pipes 211a and 211b and exit through outlet pipes 212a and 212b. As referred to herein, a "pipe" may include a single pipe or multiple pipes connected to one another (e.g., using a pipe fitting) to transport coolant. Inlet pipes 211a, 211b and outlet pipes 212a, 212b may be pipes with portions within cooling bath 200 and as shown in FIG. 2, external to cooling bath 200. In some embodiments, the coolant is at an initial temperature as it enters through inlet pipes 211a and 211b. The coolant entering cooling bath 200 is indicated by dashed arrows. The coolant exits container 200 through outlet pipes 212a, 212b. Due to the heat transfer from the circuit boards dissipating heat within the bath, the coolant exits through outlet pipes 212a, 212b at a hotter temperature. The coolant exiting cooling bath 200 is indicated by the dotted arrows. In some embodiments, the coolant is reused after exiting through outlet pipes 212a, 212b. The flow of coolant is described in further detail in the descriptions of FIGS. 10-12.

Chillers 213a, 213b may be used to cool down the coolant that is recirculated by external pumps 210a, 210b into cooling bath 200. While two chillers 211a, 211b are depicted in FIG. 2, as shown in FIG. 1, multiple chillers can align container 100 to cool the temperature of hot coolant exiting container 100. External pumps 210a, 210b may expel hot coolant through outlet pipes 212a, 212b.

Example Cooling Bath Structure

Figure 3:
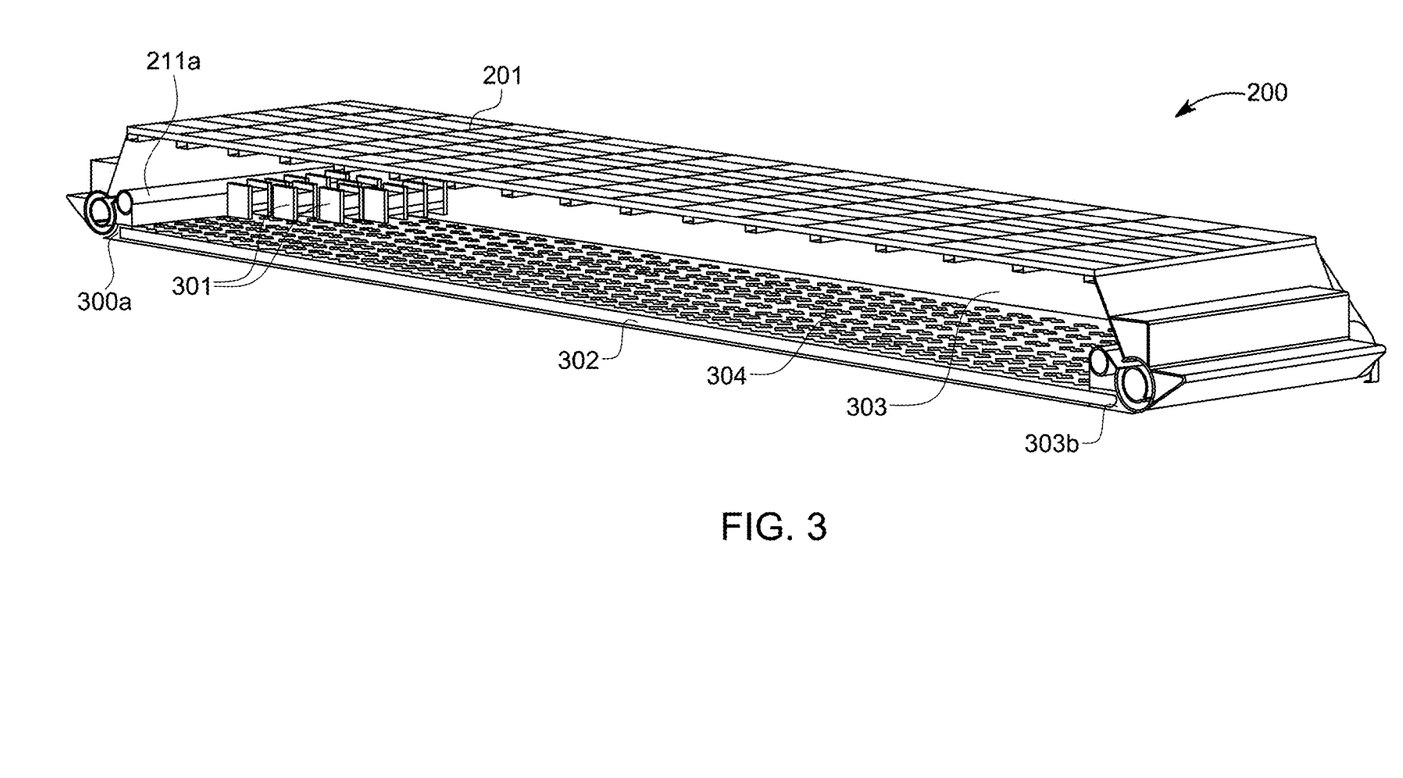
FIG. 3 illustrates an exposed view of the cooling bath of FIG. 2 according to one example embodiment.

FIG. 3 illustrates an exposed view of cooling bath 200 of FIG. 2 according to one example embodiment. The exposed view corresponds to a cross section of an interior chamber of cooling bath 200. This interior chamber may be device chamber 303. Device chamber 303 may be populated with one or more devices 301 (an example shows a few but more may be present). Devices 301 may be electronic circuit boards. Device chamber 303 is formed from the configuration of the walls, cover and base as described with FIG. 1. Cooling bath 200 includes one or more lids 201, draining sections 300a and 300b, distribution pipes 302, device chamber 303, and floor 304 with flow passages. Devices 301 may be contained within device chamber 303. Cooling bath 200 may have alternative configurations than shown in FIG. 3, include for example different, fewer, or additional components.

Coolant flows into cooling bath 200 through inlet pipes 211a, 211b on either ends of cooling bath 200. Inlet pipes 211a, 211b are aligned length-wise along the width of cooling bath 200. Inlet pipes 211a, 211b are located closer towards the center of the bath relative to the location of the draining sections 300a, 300b. In one example, the dimensions of inlet pipes 211a, 211b include a diameter of approximately 152 mm and a thickness of approximately 3 mm. Inlet pipes 211a, 211b are joined to opposing walls of cooling bath 200 such that coolant may flow in from one side of the bath while the wall on the other side of the bath seals the inlet pipe. In this way, the coolant is not exiting from the other end of the pipe. Rather, to allow coolant to exit the pipe, a side of each inlet pipe 211a, 211b within device chamber 303 of the cooling bath 200 may have calibrated holes. Inlet pipe 211a with calibrated holes that is within device chamber 303 is depicted in further detail in FIGS. 6 and 11.

Coolant that is exiting inlet pipes 211a, 211b within device chamber 303 is propagated and ultimately distributed into distribution pipes 302. In some embodiments, pressure stabilization chambers at either ends of cooling bath 200 receives the coolant as it exits from inlet pipes 211a, 211b within device chamber 303. Pressure stabilization chambers are described in more detail in the description of FIG. 5.

Distribution pipes 302 may be approximately the length of the interior of the cooling bath 200 and be arranged along the base of cooling bath 200. One or more distribution pipes 302 may be open at both ends, where one end of the pipes receive coolant from inlet pipe 211a and the other end of the pipes receive coolant from inlet pipe 211b. Each distribution pipe 302 may have calibrated holes along one side of the pipe's length to allow coolant to exit the pipe and into device chamber 303. In such embodiments, the size of the holes may be based on the total flow within the cooling bath, the length of the cooling bath, or a combination thereof. The calibrated holes may be located at the bottom of the smaller pipes to enforce equal distribution of the coolant throughout cooling bath 200. The holes may be evenly spaced along the pipes or evenly spaced in groups of holes (e.g., two holes every 5 cm). The coolant exits distribution pipes 302 from the calibrated holes at the bottom of the pipes, mixes in the bottom of cooling bath 200, and rises upwards in cooling bath 200 at a constant speed. The calibrated holes at the bottom of distribution pipes 302 may be approximately 5 mm in diameter. In some embodiments, devices 301 are arranged in rows over distribution pipes 302 and there are holes along each distribution pipe 302 corresponding to each device 301.

Device chamber 303 may be filled with coolant to dissipate heat from devices 301. A device 301 may be an electronic circuit board or may be any suitable heat-generating hardware module. For example, 7 nanometer (nm) computer chips for high performance processors can generate a large amount of heat while operating. For each device, removing, for example, 5 kilowatts (kW) of generated heat may require a coolant flow rate of 2.5 m$^3$/h through the heat exchangers on the chips. In some embodiments, 384 devices may fit within cooling bath 200. Thus, a total flow rate for even distribution of coolant to devices 301 may be 960 m$^3$/h in total. Devices 301 may be accessed within cooling bath 200 through lids 201. The lids 201 may be individually removable to easily access each device. The weight of devices 301 may be supported by floor 304.

Coolant from distribution pipes 302 flows through flow passages within floor 304 to reach devices 301. Floor 304, as with other components of cooling bath 200, may be composed of a metal, such as stainless steel or iron steel, non-metal, a ceramic, or any suitable material for supporting devices 301 and compatible with the characteristics and use of the coolant. For example, a coolant without water in it allows for an iron steel (i.e., not necessarily stainless) to be used since the absence of water prevents the iron steel floor from rusting. In some embodiments, coolant passes through the flow passages into device chamber 303 and contacts the heatsinks of devices 301, thereby cooling the integrated circuit chips through thermal transfer properties that transfer heat from the chips to the coolant via the sinks. In some embodiments, there may be a flow passage underneath each device 301.

Within device chamber 303, the coolant may begin to accumulate in a greater quantity towards the center of the bath (e.g., forming a mound of coolant centered in the middle of the bath) due to the rate of flow from each inlet pipe 211a, 211b. Because the quantity of coolant is greater in the center, the force of gravity upon coolant will cause coolant to move from the center towards the walls of cooling bath 200. In particular, the coolant will move from the center towards draining sections 300a and 300b located at either ends of cooling bath 200 along the bath's width. The coolant accumulation will be described in more detail in the description of FIG. 4.

Coolant flows out of device chamber 303 at draining sections 300a, 300b on either ends of cooling bath 200. Draining sections 300a and 300b include respective draining pipes and outlet pipes. Draining sections 300a and 300b may be located farther from the center of the bath than the inlet pipes are located. The structure of draining sections 300a, 300b allows for gravity to assist the coolant in leaving device chamber 303 with a flow rate that reduces or eliminates air from exiting the bath with the coolant. In this way, draining sections 300a, 300b prevent air from entering external pumps 210a, 210b, cavitating inside the pumps, and distorting the flow generated by pumps 210a and 210b. Furthermore, because draining sections 300a, 300b moderate the flow rate of coolant leaving cooling bath and prevents air from entering pumps 210a, 210b, draining sections 300a and 300b allow for an efficient heat exchange process within cooling bath 200. Draining sections 300a, 300b are described in further detail in the description of FIG. 5.

Figure 4:
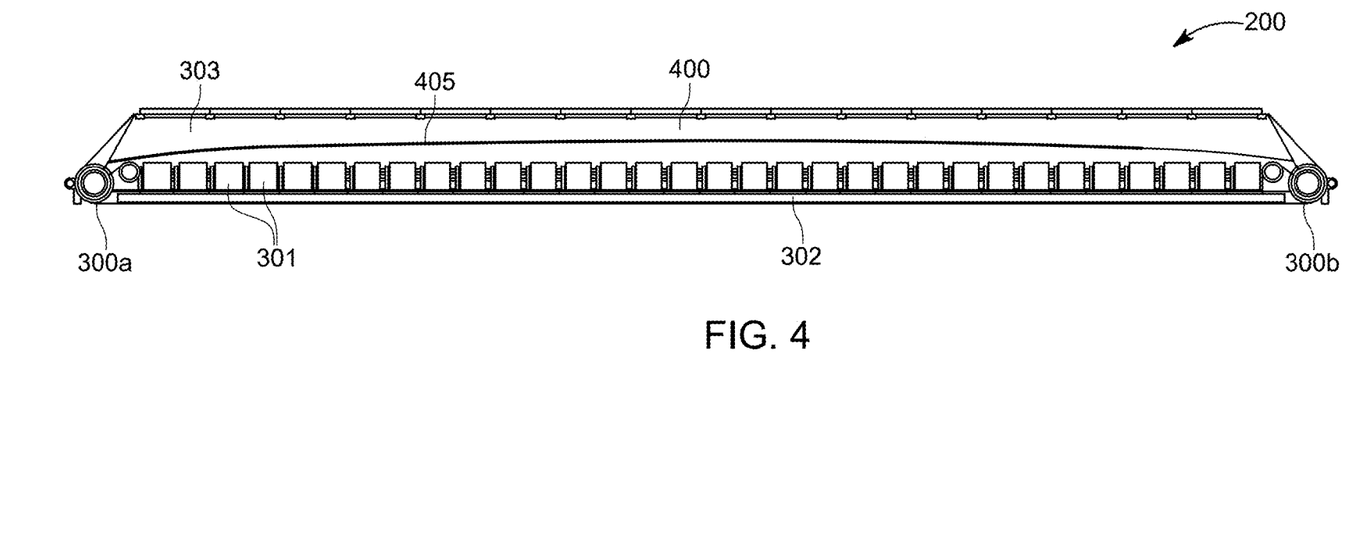
FIG. 4 illustrates the accumulation of coolant within a cooling bath according to one example embodiment.

FIG. 4 illustrates the accumulation of coolant within a cooling bath according to one example embodiment. An exposed, side view of cooling bath 200 shows draining sections 300a and 300b on opposing ends, distribution pipes 302 proximal to the base of the bath, and device chamber 303 containing devices 301. Coolant (top surface of flow illustrated by curvature line 405) is depicted as a curved mound within device chamber 303, reaching peak 400 at a certain height or height differential compared to the height of the coolant at draining sections 300a, 300b.

Coolant enters distribution pipes 302 through opposing ends of cooling bath 200 at substantially equivalent flow rates. As the coolant meets in the middle of the bath, traveling approximately 6 meters from the ends towards the center, the coolant fills cooling bath 200 from the bottom, upwards, and forms a mound-like shape with peak 400 at the center of the cooling bath (i.e., approximate midpoints of both the length and width of the bath). In some embodiments, the height differential of coolant level between peak 400 and the level of coolant at draining sections 300a, 300b is approximately 10 centimeters (cm). For example, the coolant level at the draining sections may be at approximately 500 cm from the base of cooling bath 200 and peak 400 may be 510 cm from the base. The height differential may change depending on the ambient temperature surrounding the cooling bath. For example, as temperatures lower and causes coolant to gain viscosity, the height differential may increase to create the same operation occurring with a 10 cm height differential at an ideal or normal operating temperature.

Figure 5:
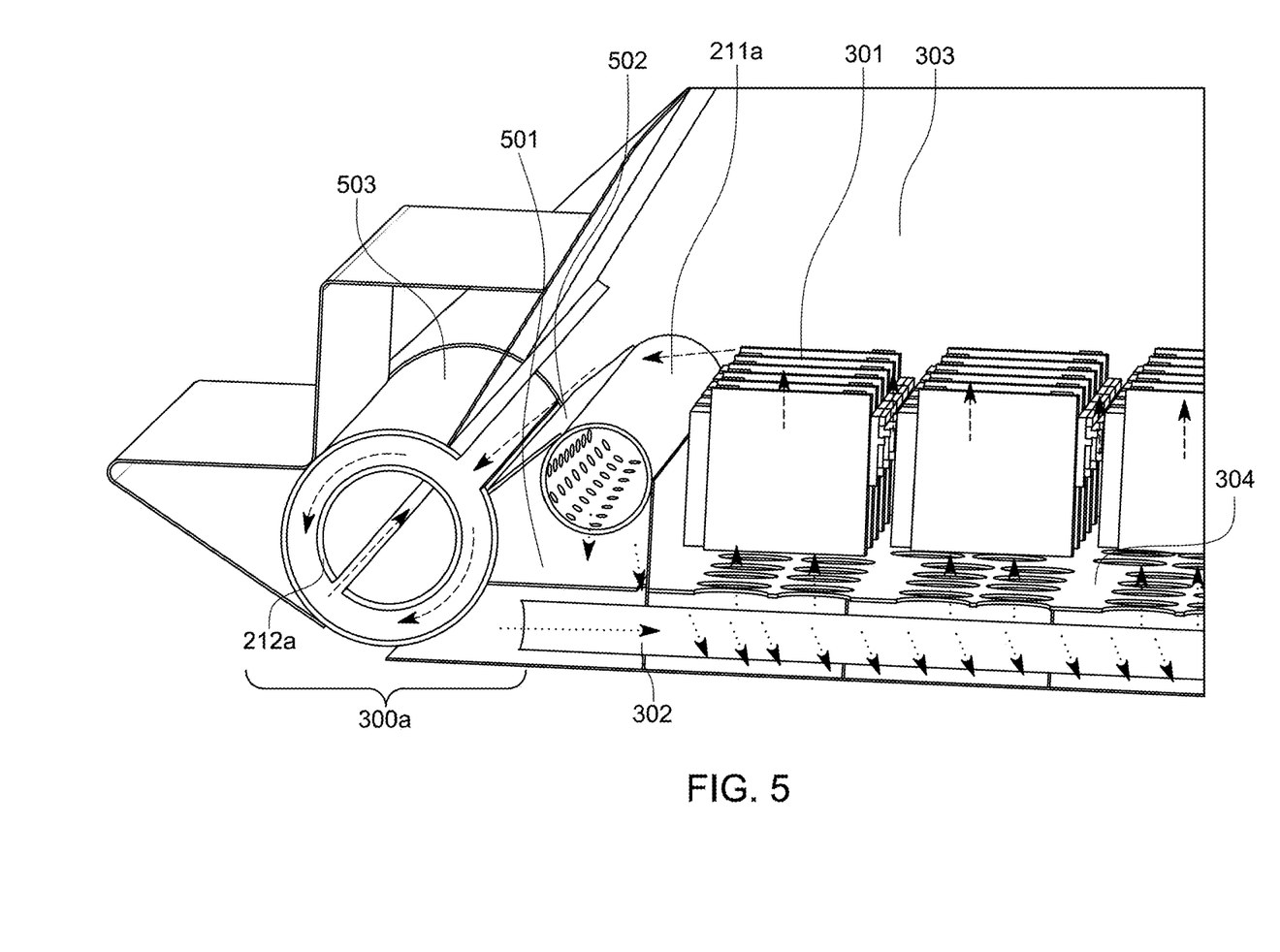
FIG. 5 illustrates a draining section of a cooling bath according to one example embodiment.

FIG. 5 illustrates a draining section of a cooling bath according to one example embodiment. Cooling bath 300a is coupled to device chamber 303, receiving hot coolant that has been used to cool devices 301. Coolant flow is shown via dashed and dotted arrows, where the dashed arrows indicate coolant at an initial temperature before receiving heat transferred from devices 301 and the dotted arrows indicate coolant at a higher temperature after receiving the heat.

Coolant enters cooling bath 200 through inlet pipe 211a. One side of each inlet pipe may have calibrated holes along the length of the pipe. These calibrated holes may allow the coolant to be evenly distributed within pressure stabilization chamber 501. Because the pressure of coolant entering through inlet pipe 211a is relatively large, pressure stabilization chamber 501 may modify the pressure such that coolant may evenly distribute into distribution pipes 302. This stabilization may be achieved through the presence of a sheet with a slit between inlet pipe 211a and distribution pipes 302. Pressure stabilization chamber 501 is described in more detail in the description of FIG. 6. Coolant exits distribution pipes 302 through calibrated holes along the length of the pipes, filling device chamber 303 with coolant from the bottom, upward.

After cooling devices 301, coolant flows in a direction from the center of the bath towards the nearest draining section. To enter draining section 300a, coolant flows over inlet pipe 211a and down sloped floor 502. The slope of the floor may be determined based on the angle of the entrance into draining section 300a. The calculation of this angle is discussed in further detail in the description of FIGS. 8-9.

Each draining section may include concentric draining pipes and outlet pipes. For example, draining section 300a includes concentric draining pipe 503 and outlet pipe 212a. The draining pipes and outlet pipes may have a shared center that is lower along the height of the bath than the height of the center of the proximal inlet pipe. This allows gravity to assist coolant in entering the draining section. For example, inlet pipe 211a is higher along the height of cooling bath 200 than draining pipe 503 and outlet pipe 212a such that coolant flows downward to draining pipe 503 along sloped floor 502.

A slit that runs along the length of draining pipe 503 allows coolant to enter draining pipe 503. The slit may be four-sided, where two sides running along the length of draining pipe 503. In some embodiments, the slit may be as long as or longer than the width of cooling bath 200 (i.e., when angled and not parallel to the width of the bath, a length of the slit may be longer). The slit does not necessarily run along the entire length of the bath. The two sides may be bounded by third and fourth sides such that the slit tapers towards one side of the bath. Similarly, outlet pipe 212a has a slit that runs along its length. Dimensions of a slit are described in further detail in the description of FIG. 9.

The flow of coolant passing through draining section 300a may be characterized into a set of predetermined stages, e.g., three draining stages. In a first draining stage, the coolant accumulates at the entrance of draining pipe 503 due to a combination of the flow of coolant traveling down a particular height differential (e.g., 10 cm) and the limited opening afforded by the slit. In a second draining stage, the coolant flows within the space between draining pipe 503 and outlet pipe 212a. Coolant flows around draining pipe 503 to reach the inside of outlet pipe 212a. In a third draining stage, coolant enters outlet pipe 212a and exits cooling bath 200. The coolant enters outlet pipe 212a through a slit within the pipe. The slit may be located proximal to the base of cooling bath 200.

The structure of draining section 300a prevents coolant from draining too quickly and allowing air to escape cooling bath 200 with the coolant. For example, the positioning of the draining pipe and outlet pipe at relatively low position in the bath enables the first draining stage's angled entrance into draining pipe 503 to slow the flow of coolant out of cooling bath 200, allowing coolant to fill the entrance and substantially eliminate air exiting through draining section 300a.

Foundation for Coolant Suction Geometry Calculation

Figure 6:
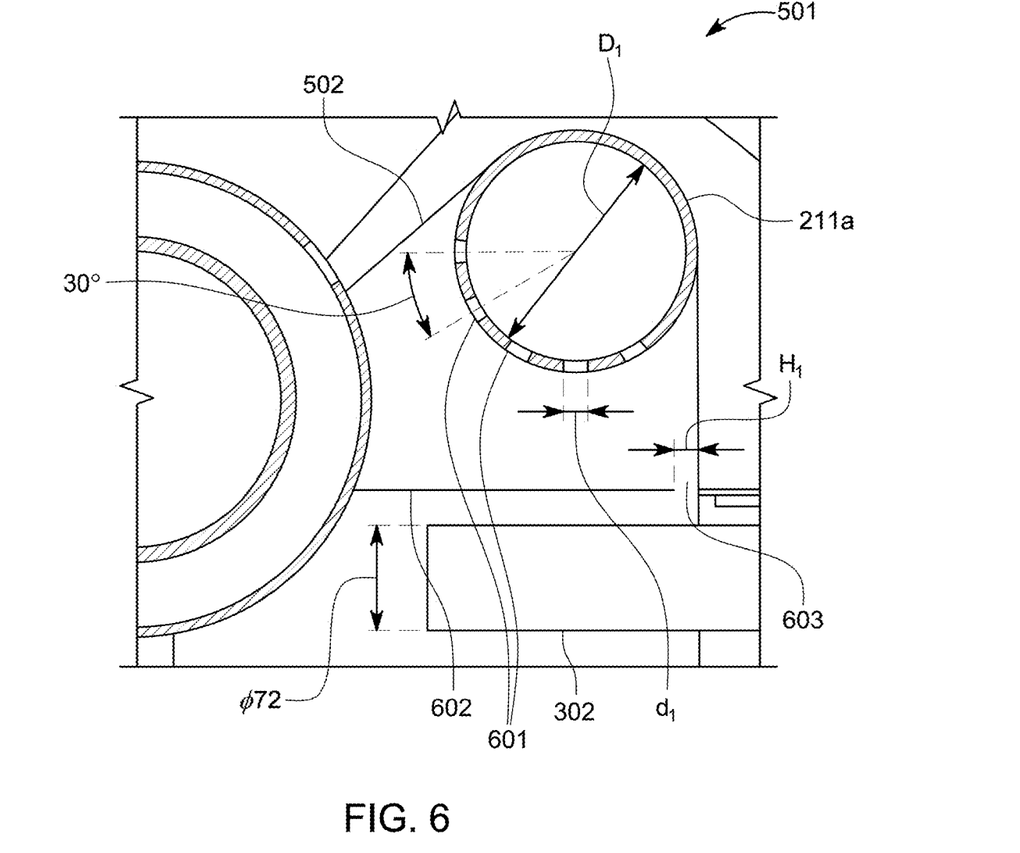
FIG. 6 shows dimensions of a pressure stabilization chamber of a cooling bath according to one example embodiment.

FIG. 6 shows dimensions of a pressure stabilization chamber of a cooling bath according to one example embodiment. In some embodiments, pressure stabilization chamber 501 is structured to split the flow of coolant entering from inlet pipe 211a into substantially equal parts. The operation of pressure stabilization chamber 501 may be dependent on certain geometric parameters such as the number of calibrated holes 601 in inlet pipe 211a and the width of slot 603 within sheet 602.

Pressures stabilization chamber 501 may be divided into stages of coolant collection, where equal flow distribution occurs within each stage. In some embodiments, there are two stages of collection that correspond to two portions of pressure stabilization chamber 501 that sheet 602 divides. For example, in the first collection stage, coolant passes through inlet pipe 211a via calibrated holes 601 and into a first portion of chamber 501. The structure of the first portion of chamber 501 may include a hermetic primary chamber with inlet pipe 211a having diameter $D_1$.

Figure 7:
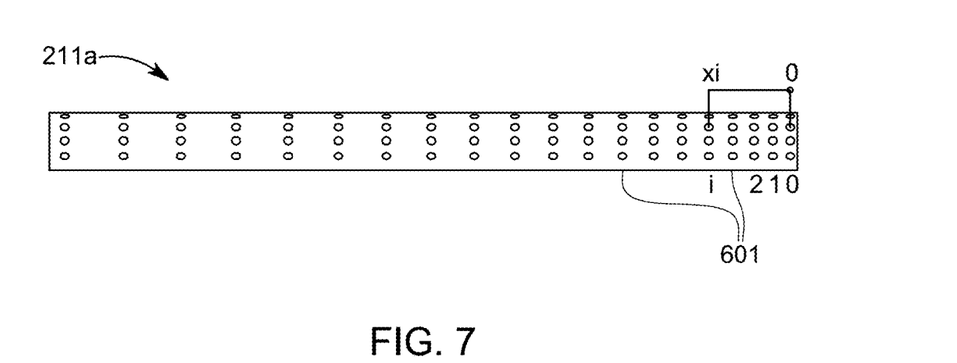
FIG. 7 illustrates an inlet pipe with calibrated holes according to one example embodiment.

FIG. 7 illustrates an inlet pipe with calibrated holes according to one example embodiment. Calibrated holes 601 may have a diameter $d_1$ and be located along the bottom of the length of inlet pipe 211a. There may be at least 50 holes along inlet pipe 211a. The maximum number of holes may be determined based on the technological process for manufacturing inlet pipe 211a and the length of inlet pipe 211a. The diameter $d_1$ of calibrated holes 601 may be calculated using Equation 1.

$$d_1 = \sqrt{\frac{D_1^2}{K \times N}} \quad \text{(Equation 1)}$$

Where K is an adjustable coefficient that may have the value 0.6 for optimal flow distribution within the first portion of chamber 501, $D_1$ is the diameter of inlet pipe 211a, and N is the number of calibrated holes 601.

The number of calibrated holes 601 may be determined based on the number of rows X of holes along inlet pipe 211a and the number of holes Y in each row. In some embodiments, the number of holes in each row may be the same (i.e., the holes are evenly distributed along the circumference of inlet pipe 211a). An optimal ratio X/Y of rows to holes within each row may be in a range from 1/3 to 1/5. Parameters X, Y, and d may be used to calculate distance $X_i$ for each row, as shown in Equation 2.

$$X_i = \left(0.6511 \times \left(\frac{i}{X}\right)^2 + 0.4341 \times \frac{i}{X}\right) \times (L - 2l) \quad \text{(Equation 2)}$$

Where i represents the index of the row from i=0, . . . , X, $X_2$ is the distance from the first hole to hole i in millimeters, l is the distance from the side proximal to cooling bath 200 to the first hole, and L is the length of inlet pipe 211a. In some embodiments, L is also the length of the width of cooling bath 200.

The spacing of calibrated holes 601 from one another along both the circumference and length of inlet pipe 211a may impact the speed and pressure of coolant exiting inlet pipe 211a. As shown in FIG. 7, calibrated holes 601 are spaced such that the density of calibrated holes 601 lowers with increasing distance from the end of inlet pipe 211a proximal to external pump 210a. Such spacing affects the speed and pressure of the coolant exiting inlet pipe 211 such that the coolant flow within the first portion of chamber 501 may be substantially even throughout the chamber.

In a second collection stage that pressure stabilization chamber 501 is divided into, coolant passes through slot 603 of width $H_1$ in sheet 602 and into a second portion of chamber 501. Slot 603 may have a length $L_1$ and span the width of cooling bath 200 (i.e., length L1 is approximately 2 m). The structure of the second portion of chamber 501 may include a hermetic secondary chamber with openings of distribution pipes 302. For example, the second portion of chamber 501 may have 12 openings of distribution pipes 302, each having a diameter of 72 mm.

The width of slot H may be calculated using Equation 3.

$$H = \frac{\pi \times D^2}{4 \times L \times K_2 \times K_1} \quad \text{(Equation 3)}$$

where coefficients $K_1$=0.6 and $K_2$=0.95.

Figure 8:
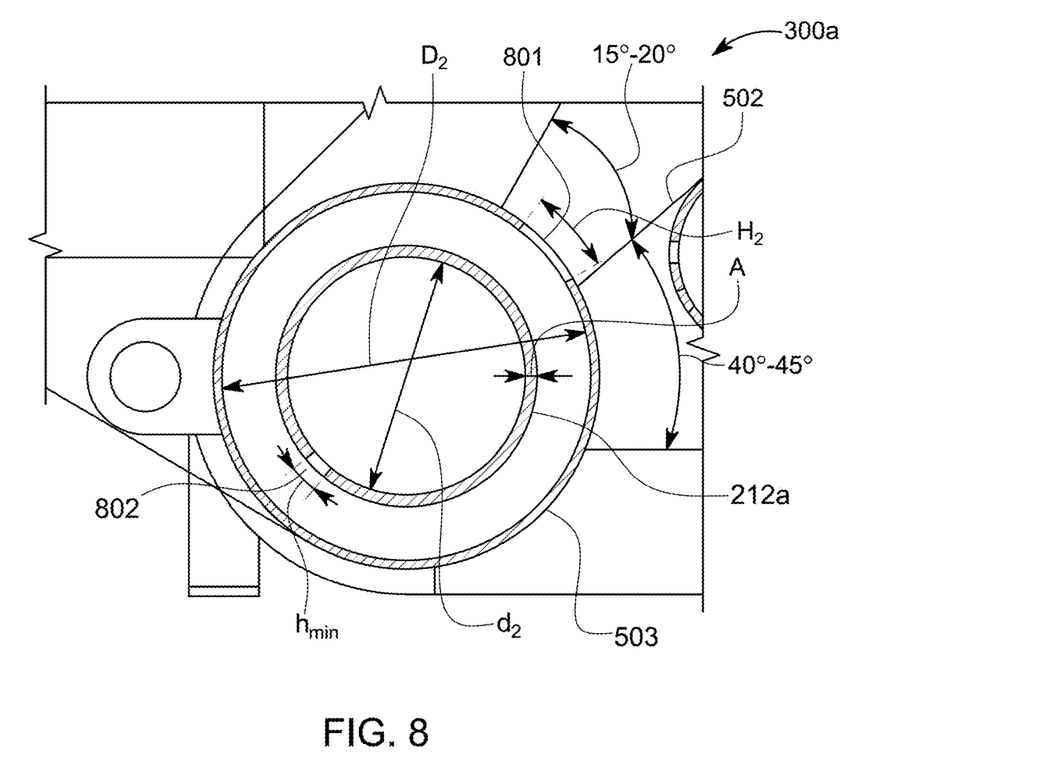
FIG. 8 shows dimensions of a draining section of a cooling bath according to one example embodiment.

FIG. 8 shows dimensions of draining section 300a of cooling bath 200 according to one example embodiment. Coolant suction within draining section 300a is dependent upon the structure of draining section 300a. The structure of draining section 300a is characterized by parameters such as the minimum width $H_2$ of slit 801 and diameter $D_2$ of draining pipe 503, the angle from horizon (e.g., the level or plane on which the distribution pipes reside) to sloped floor 502, the angle formed by the entrance of the second draining stage, the thickness A, diameter $d_2$, and minimum width $h_{min}$ of slit 802 of outlet pipe 212a.

Hot coolant enters draining pipe 503 via slit 801 of minimum width $H_2$ of draining pipe 503 with diameter $D_2$. The coolant passes between the inner surface of draining pipe 503 and the outer surface of outlet pipe 212a from both sides of outlet pipe 212a via a passage that is of a width equivalent to $D_2-(d_2+A)$ to slit 802 of width $h_{min}$ and then via outlet pipe 212a with diameter $d_2$ to the pump suction generated by external pump 210a. Diameter $d_2$ of the outlet pipe is not necessarily the same length as diameter $D_1$ of the inlet pipe. For example, $d_2$ may be approximately 203 mm while $D_1$ is approximately 152 mm.

Equations 4-6 may be used to characterize the structure such as the diameter of the draining pipe, minimum width of slit 802, and the minimum width of slit 801. Diameter $D_2$ of draining pipe 503 may be calculated by Equation 4.

$$D_2 = K_1 \times d_2 + K_2 \times A \quad \text{(Equation 4)}$$

where $K_1$ may be a value from 1.45-1.55 and $K_2$ may be a value from 1.15-1.25 depending on the piping standards applied.

Width H of draining pipe 503 may be calculated by Equation 5.

$$H = (\pi \times D_2^2 - \pi \times d^2 - 4 \times d_2 \times A - 4 \times A^2)/4 \times K \times L \times H_2 \quad \text{(Equation 5)}$$

Where K is an adjustable coefficient and where L is the length of both draining pipe 503. In some embodiments, inlet pipe 211a, draining pipe 503, and outlet pipe 212a have the same length L. However, the length of inlet pipe 211a, draining pipe 503, and outlet pipe 212a need not always be equivalent. In some embodiments, K=0.4 has been determined to be the ideal value for K through computer simulation of coolant suction through a draining section.

Figure 9:
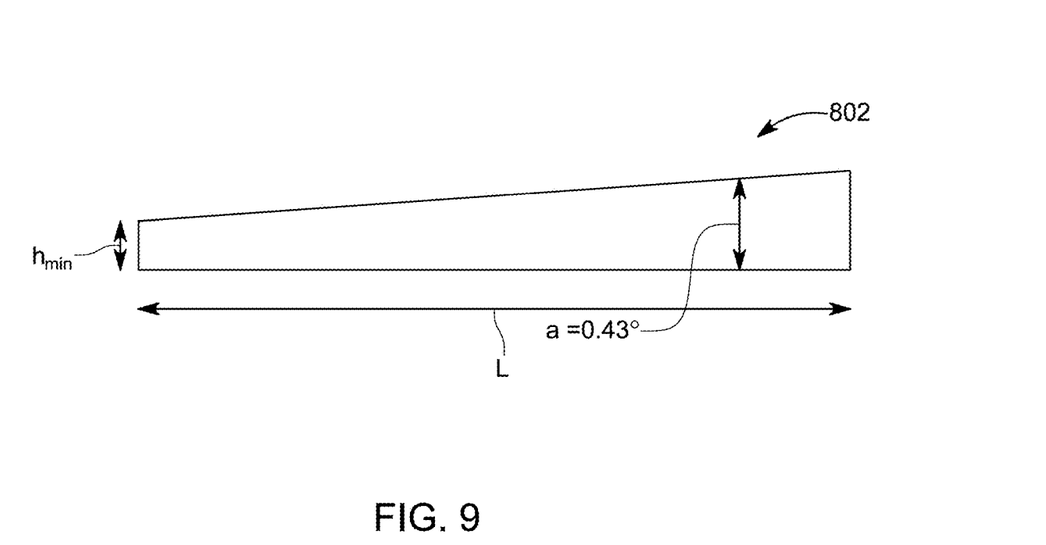
FIG. 9 shows dimensions of a slit of a pipe of FIG. 6 according to one example embodiment.

FIG. 9 shows dimensions of a slit of a pipe of FIG. 8 according to one example embodiment. FIG. 9 may show slit 802 of outlet pipe 212a, where slit 802 is shaped like a trapezoid with length L and angle α of 0.43 degrees. One side of the trapezoid is $h_{min}$ and is located proximal to external pump 210a. Slit 802 may be designed such that the most coolant enters through slit 802 farthest from the side proximal to external pump 210a, as shown in FIG. 9, and less coolant enters through the slit 802 approaching the pump's side. Because of this structure, slit 802 allows for even flow of coolant through external pipe 212a along the width of cooling bath 200. In some embodiments, length L is approximately the width of cooling bath 200. The minimum width of slit 802, $h_{min}$, may be calculated according to Equation 6 below.

$$h_{min} = \frac{K \times \pi \times d_2^2}{4 \times L} - 0.5 \times L \times \tan(a) \quad \text{Equation 6}$$

Where tan (α) represents the tangent of the angle α formed from the opposing sides of slit 802 along the length of outlet pipe 212a and L is the length of slit 802 in outlet pipe 212a.

In some embodiments, the angle from horizon to sloped floor 502 may be within a range of 40-45 degrees. The shape of the entrance to draining section 300a, as depicted in the two-dimensional cross section of FIG. 8, may be shaped similarly to an annulus sector (i.e., two concentric, rounded lines bounded at both ends by straight lines), tapering in towards draining pipe 503 from device chamber 303. In some embodiments, the angle formed by the entrance (i.e., by the straight lines of the annulus sector) may be within a range of 15-20 degrees. As the angle of the entrance increases, the speed of coolant at the entrance decreases. The slower coolant speeds may lead to liquid breakage and the creation of air bubbles within draining section 300a and subsequently, external pump 210a. On the other hand, as the angle of the entrance decreases, coolant entering draining section 300a may cause foam to form at the entrance and decrease the efficiency of cooling bath 200.

Figure 10:
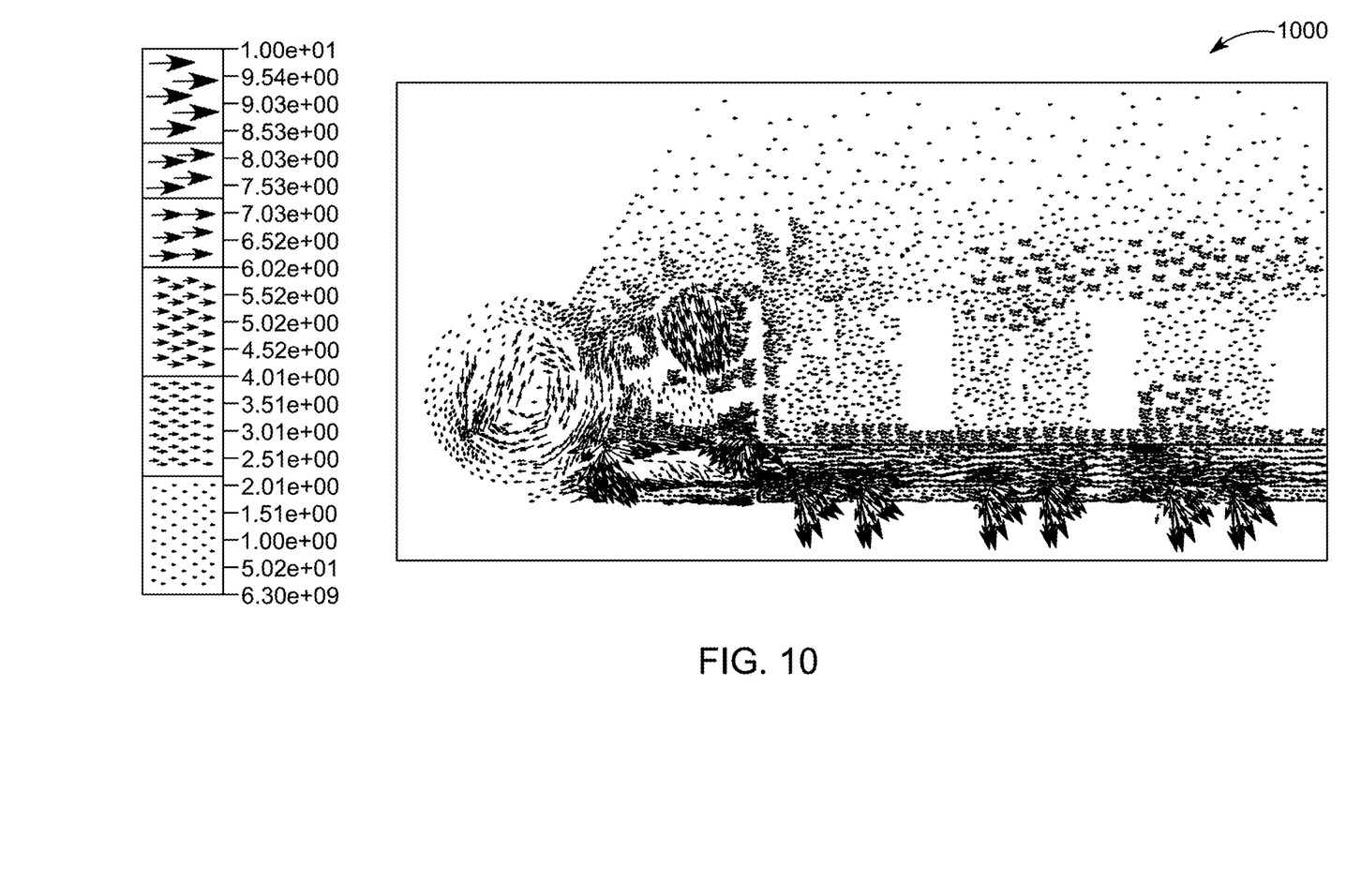
FIG. 10 depicts a visualization of coolant flow vectors inside a cooling bath according to one example embodiment.

FIG. 10 depicts visualization 1000 of coolant flow vectors inside a cooling bath according to one example embodiment. The coolant flow vectors are depicted using arrows indicating the direction of the vectors within the bath and the intensities according to stippling level. In particular, the coolant flows faster through inlet pipes and slows upon entering a pressure stabilization chamber. As the coolant leaves the pressure stabilization chambers and into the distribution pipes, the coolant gains velocity. Coolant exiting the distribution pipes through the calibrated holes along the pipes also gains velocity. As the coolant enters the device chamber from the base, upward, the coolant velocity decreases. A mound of coolant is formed towards the center of the cooling bath and gravity assists the coolant's exit through draining sections. Near the entrance of draining sections and while traveling through both stages of the draining sections, the velocity of coolant is relatively slow due to the structure of the draining section preventing coolant from draining too quickly and allowing air to escape the bath as well.

Figure 11:
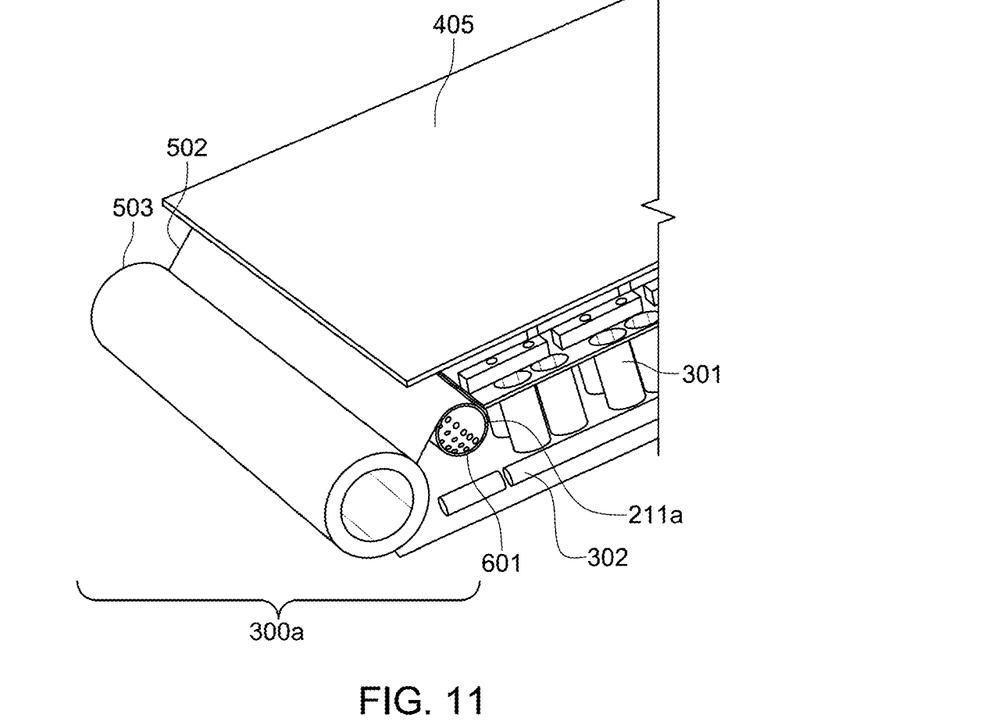
FIG. 11 depicts coolant entering a draining section according to one example embodiment.

FIG. 11 depicts coolant entering a draining section according to one example embodiment. Coolant flows into draining section 300a with assistance from gravity. As coolant begins to enter draining section 300a, the coolant may contact sloped floor 502 from the center, outward. Although, for emphasis, coolant is shown only at the top of the device chamber and flowing into the draining section, coolant may flow throughout the cooling bath. For example, coolant may also be entering the cooling bath through inlet pipe 211a, depicted with an example of calibrated holes for allowing the coolant to exit inlet pipe 211a. In some embodiments, calibrated holes are evenly distributed along the bottom of inlet pipe 211a. The distribution of calibrated holes along inlet pipe 211a allows coolant to enter distribution pipes 302 with substantially equivalent flow through each pipe. Although not depicted in FIG. 11, outlet pipe 212a may be concentric to draining pipe 503 and draining pipe 503 may have slit 801 for the coolant to enter draining section 300a.

Figure 12:
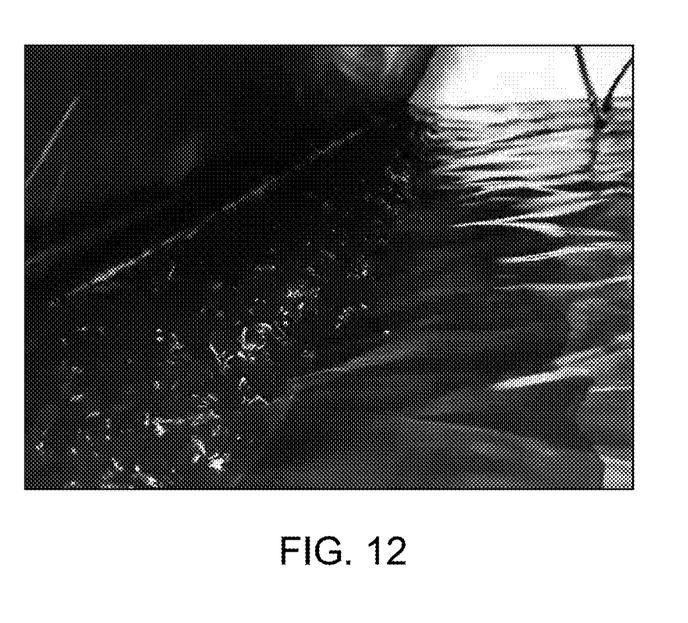
FIG. 12 depicts the accumulation of coolant at the entrance of a draining section according to one example embodiment.

FIG. 12 depicts the accumulation of coolant at the entrance of a draining section according to one example embodiment. As described in the description of FIGS. 8-9, the design of the draining section and particularly, the angle of the entrance into the cooling chamber (e.g., an angle within a range of 15-20 degrees) effects the accumulation of coolant at the entrance. The angle may be determined such that the coolant fills the entrance, as shown in FIG. 12, without allowing air to enter the draining section.

Flow Rate Control System

The height of coolant accumulated at the center of a cooling bath may depend upon factors such as the flow rate generated by external pumps coupled to the cooling bath and the ambient temperature outside the cooling bath. For example, when the flow rate generated by the pumps is too low, the coolant may not accumulate and reach a certain height within the bath (e.g., peak 400) before leaving through draining sections. Additionally, temperature outside the cooling bath may also affect the coolant's ability to accumulate within the bath. As temperatures outside the cooling bath lower, the viscosity of the coolant increases and a higher flow rate may be needed to reach a specific height within the bath.

Operation of the external pumps may be adjusted to maintain a specific height of coolant at the center of the bath. In some embodiments, the working condition of the cooling bath is managed by a programmable logic controller (PLC), the VFD of each external pump (e.g., with MODBUS protocol), and a number of pressure and temperature sensors. PLC software may monitor temperatures of the coolant flowing through inlet and outlet pipes and adjusts a value of pump flow via Modbus protocol directly to the VFD.

There may be two modes of operation: preheating and normal operation. During preheating, the PLC lowers the flow rate generated by the external pump since the viscosity of the coolant is higher at lower temperatures. Once a temperature sensor provides a temperature reading to the PLC indicating that a target temperature has been reached, the PLC will initiate normal operation automatically. A target temperature for coolant entering the cooling bath may be approximately 55 degrees Celsius. The coolant may heat up to approximately 61 degrees Celsius as it passes through the heat sinks of the devices within the device chamber.

Pressure sensors may take measurements at both inlet and outlet pipes to provide feedback to the PLC. The inlet and outlet pressure sensors may be used to monitor possible coolant leaking or pipe blocking. In some embodiments, although coolant levels in the bath varies over time, a level sensor may provide a rudimentary indicator of possible leaks in the cooling system. Pressure sensors at the inlet and outlet pipes, however, may detect leaks with a lower false positive rate because its measurements of pressure are substantially independent of the varying coolant level within the bath. Fluctuation in pressure may be analyzed to determine whether there are possible leaks in the cooling system. For example, if the coolant level within the bath drops, the external pumps may begin to intake air from the cooling bath, which is reflected in the pressure sensor readings.

Additional Configuration Considerations

One advantage of the cooling bath structure described herein is the prevention of air within the cooling bath from entering the external pumps. When air enters the pumps, air cavitates inside the pump, which affects the flow generated by the pump, generates bubbles of air within the coolant, and reduces the efficiency of the heat exchange process within the cooling bath. The draining section described herein is structured to slow the flow of coolant exiting the cool bath while allowing enough liquid to fill any gaps in exits in the bath that would otherwise be occupied by air.

Additionally, the cooling system, including the external pumps and PLC-enabled control system, is able to self-regulate coolant flow throughout the bath. The cooling system measures pressure of the cooling bath (e.g., at the inlet and outlet pipes) and temperature of the environment outside of the bath to modify operations of the external pumps based on the measured pressure and/or temperature. In this way, the flow rate within the cooling bath can be controlled and a specific height of coolant can be achieved to produce the coolant accumulation needed at the entrance of draining sections to prevent air from being sucked out of the cooling bath and cavitating within the external pump.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including a number of components, modules, or mechanisms. Modules may constitute either software modules (e.g., code embodied on a machine-readable medium or in a transmission signal) or hardware modules. A hardware module is tangible unit capable of performing certain operations and may be configured or arranged in a certain manner. Accordingly, the term "hardware module" should be understood to encompass a tangible entity, be that an entity that is physically constructed, permanently configured (e.g., hardwired), or temporarily configured (e.g., programmed) to operate in a certain manner or to perform certain operations.

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

Where values are described as "approximate" or "substantially" (or their derivatives), such values should be construed as accurate+/−10% unless another meaning is apparent from the context. From example, "approximately ten" should be understood to mean "in a range from nine to eleven."

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. It should be understood that these terms are not intended as synonyms for each other. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

While particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A cooling system comprising:
a holding unit comprising:
a first inlet pipe and a second inlet pipe located at opposite ends of the holding unit, the first inlet pipe and the second inlet pipe structured to allow a coolant to enter the holding unit through the first inlet pipe and the second inlet pipe,
a first pressure stabilization chamber coupled to the first inlet pipe and a second pressure stabilization chamber coupled to the second inlet pipe,
a plurality of distribution pipes coupled to the first stabilization chamber and the second pressure stabilization chamber, wherein:
a first end of each of the distribution pipes is coupled to the first pressure stabilization chamber;
a second end of each of the distribution pipes is coupled to the second pressure stabilization chamber; and
each of the distribution pipes includes a plurality of calibrated holes,
a device chamber comprising a floor having a plurality of flow passages, the floor structured to: 4862-7141-3258.v1 Ivan KIRILLOV—U.S. Ser. No. 17/084, 006 Response to OA mailed 24 Nov. 2021
support a weight of a device that generates heat; and
allow a flow of the coolant from the plurality of calibrated holes to the device, and
a first draining section and a second draining section coupled to the device chamber, each of the first draining section and the second draining section comprising:
a draining pipe, the draining pipe having a first slit; and
an outlet pipe, the outlet pipe having a second slit and concentric to the draining pipe,
wherein the first draining section is located proximate to the first inlet pipe and at a first of the opposite ends of the holding unit such that the coolant flows over the first inlet pipe into the first draining section and the second draining section is located proximate to the second inlet pipe at a second of the opposite ends of the holding unit such that the coolant flows over the second inlet pipe into the second draining section;
a first external pump coupled to the outlet pipe of the first draining section to allow the coolant to expel from the holding unit through the outlet pipe of the first draining section; and
a second external pump coupled to the outlet pipe of the second draining section to allow the coolant to expel from the holding unit through the outlet pipe of the second draining section.

2. The cooling system of claim 1, wherein a center of each draining pipe is located lower along a height of the holding unit than centers of the first inlet pipe and the second inlet pipes along the height of the holding unit.

3. The cooling system of claim 1, wherein the coolant rises to a peak within the device chamber at a location corresponding to both a midpoint of a length of the holding unit and a midpoint of a width of the holding unit.

4. The cooling system of claim 1, wherein the first inlet pipe and second inlet pipe are aligned lengthwise along a width of the holding unit.

5. The cooling system of claim 1, wherein each draining pipe is aligned lengthwise along a width of the holding unit.

6. The cooling system of claim 1, further comprising a cover, wherein the cover comprises a plurality of lids.

7. The cooling system of claim 1, further comprising a cover and a base, wherein a length of the cover is less than a length of the base.

8. The cooling system of claim 7 wherein the plurality of calibrated holes of each of the plurality of distribution pipes are structured to direct the flow of the coolant from the plurality of distribution pipes and towards the base.

9. The cooling system of claim 1, wherein a radius of each outlet pipe is smaller than a radius of each draining pipe.

10. The cooling system of claim 1, wherein, in the draining pipe for each of the first draining section and the section draining section, the first slit has a first width at a first end of the draining pipe and a second width at a second end of the draining pipe.

11. The cooling system of claim 1, wherein, in the outlet pipe for each of the first draining section and the section draining section, the second slit has a first width at a first end of the outlet pipe and a second width at a second end of the outlet pipe.

12. The cooling system of claim 1, wherein the holding unit further comprises:
a plurality of walls, each wall of the plurality of walls comprising a first wall surface and a second wall surface, the first wall surface and the second wall surface bounded by a first side edge, a second side edge, a top edge, and a bottom edge, the plurality of walls including:
first and second walls opposite one another along a length of the holding unit, and
third and fourth walls opposite one another along a width of the holding unit and adjacent to the first wall and the second wall;
a cover having a first cover surface and a second cover surface, the first cover surface and the second cover surface bounded by a first edge, a second edge, a third edge, and a fourth edge, the first, second, third, and fourth edges of the cover joined to a top edge of the plurality of walls, the cover dimensioned based on a width and a length of the holding unit; and
a base having a first base surface and a second base surface, the first base surface and the second base surface bounded by a first edge, a second edge, a third edge and a fourth edge, the first, second, third, and fourth edges of the first base surface joined to the bottom edges of the plurality of walls, the base dimensioned based on the width and the length of the holding unit.

13. The cooling system of claim 1, further comprising:
a pressure sensor configured to measure a pressure associated with the flow of the coolant through the holding unit; and
one or more processors configured to modify, based on the measured pressure, a rate of the flow of the coolant by controlling at least one of the first external pump or the second external pump.

14. The cooling system of claim 1, further comprising:
a temperature sensor configured to measure a temperature outside of the holding unit; and
one or more processors configured to modify, based on the measured temperature, a rate of the flow of the coolant by controlling at least one of the first external pump or the second external pump.

15. A method for cooling a holding unit, the method comprising:
receiving a coolant through an inlet pipe;
propagating the coolant from the inlet pipe into a pressure stabilization chamber;
propagating the coolant from the pressure stabilization chamber through a plurality of distribution pipes, each of the distribution pipes comprising:
an open end structured to receive the coolant from the pressure stabilization chamber, and
a plurality of calibrated holes;
propagating the coolant from the plurality of calibrated holes into a device chamber through a plurality of flow passages in a floor of the device chamber;
accumulating the coolant within the device chamber such that the coolant within the device chamber rises to a peak;
propagating the coolant from the device chamber through a first slit of a draining pipe of a draining section;
propagating the coolant from the draining pipe through a second slit of an outlet pipe of the draining section concentric to the draining pipe; and
expelling the coolant through the outlet pipe.

16. The method of claim 15, wherein the peak within the device chamber is at a location corresponding to both a midpoint of a length of the holding unit and a midpoint of a width of the holding unit.

17. The method of claim 15, wherein a center of the draining pipe is located lower along a height of the holding unit than a center of the inlet pipe is located along the height of the holding unit.

18. The method of claim 15, wherein the inlet pipe is aligned lengthwise along a width of the holding unit.

19. The method of claim 15, further comprising:
measuring a pressure associated with a flow of the coolant through the holding unit; and
modifying, based on the measured pressure, a rate of the flow of the coolant by controlling an external pump coupled to the holding unit.

20. The method of claim 15, further comprising:
measuring a temperature outside of the holding unit; and
modifying, based on the measured temperature, a flow rate of the coolant by controlling an external pump coupled to the holding unit.

* * * * *